(12) United States Patent
Shibata (10) Patent No.: US 7,285,446 B2
(45) Date of Patent: Oct. 23, 2007

(54) MOUNTING STRUCTURE OF SEMICONDUCTOR CHIP, SEMICONDUCTOR DEVICE AND METHOD OF MAKING THE SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 124 days.

(21) Appl. No.: 11/065,070

(22) Filed: Feb. 25, 2005

(65) Prior Publication Data

US 2005/0142691 A1 Jun. 30, 2005

Related U.S. Application Data

(62) Division of application No. 09/958,094, filed as application No. PCT/JP01/00829 on Feb. 6, 2001, now abandoned.

(30) Foreign Application Priority Data

Feb. 7, 2000 (JP) .............................. 2000-28818

(51) Int. Cl.
*H01L 21/48* (2006.01)
*H01L 29/40* (2006.01)
(52) U.S. Cl. .................. 438/118; 257/783; 257/792
(58) Field of Classification Search ............. 257/737, 257/787, 783–785, 792; 438/614, 118–119, 438/127
See application file for complete search history.

(56) References Cited

U.S. PATENT DOCUMENTS 5,450,283 A 9/1995 Lin et al. .................. 361/704
5,814,894 A * 9/1998 Igarashi et al. ............. 257/787
5,821,320 A * 10/1998 Maeda et al. ............... 528/173
5,864,178 A 1/1999 Yamada et al. ............. 257/737
5,937,320 A 8/1999 Andricacos et al. ........ 438/614

FOREIGN PATENT DOCUMENTS

| JP | 10-107086 | 4/1998 |
| JP | 10-199936 | 7/1998 |
| JP | 11-026652 | 1/1999 |
| JP | 11-220077 | 8/1999 |
| JP | 2001-060641 | 3/2001 |

OTHER PUBLICATIONS

English language Abstracts of JP 10-107086 and 2001-060641.
Copy of Japanese Office Action dated Jun. 27, 2006 citing the above references.
Article entitled "Electronic Packaging And Interconnection Handbook" by Charles A. Harper, published in Technology Seminars, Inc., Lutherville, Maryland, ISBN 0-07-026684-0, 1991.

* cited by examiner

*Primary Examiner*—Calvin Lee
(74) *Attorney, Agent, or Firm*—Michael Bednarek; Paul, Hastings, Janofsky & Walker LLP (57) ABSTRACT

The present invention provides a mounting structure of a semiconductor chip (3) onto an insulated substrate (2). The insulated substrate (2) is made of a polyimide resin, at least side surfaces (3c) of the semiconductor chip (3) is protected by a protective resin (5) provided by a polyimide resin. The semiconductor chip (3) is held by the protective resin (5) with respect to the insulated substrate (2). Preferably, an adhesive layer (4) is provided between the semiconductor chip (3) and the insulated substrate (2). The adhesive layer (4) is also provided by a polyimide resin.

3 Claims, 10 Drawing Sheets

MOUNTING STRUCTURE OF SEMICONDUCTOR CHIP, SEMICONDUCTOR DEVICE AND METHOD OF MAKING THE SEMICONDUCTOR DEVICE

This application is a divisional of patent application Ser. No. 09/958,094, Oct. 5, 2001, was abandoned, which is a 371 of PCT/JP01/00829 Feb. 6, 2001.

TECHNICAL FIELD

The present invention relates to a mounting structure of a semiconductor chip onto a polyimide substrate, a semiconductor device having this mounting structure and a method of manufacturing this semiconductor device.

BACKGROUND ART

Figure 12:
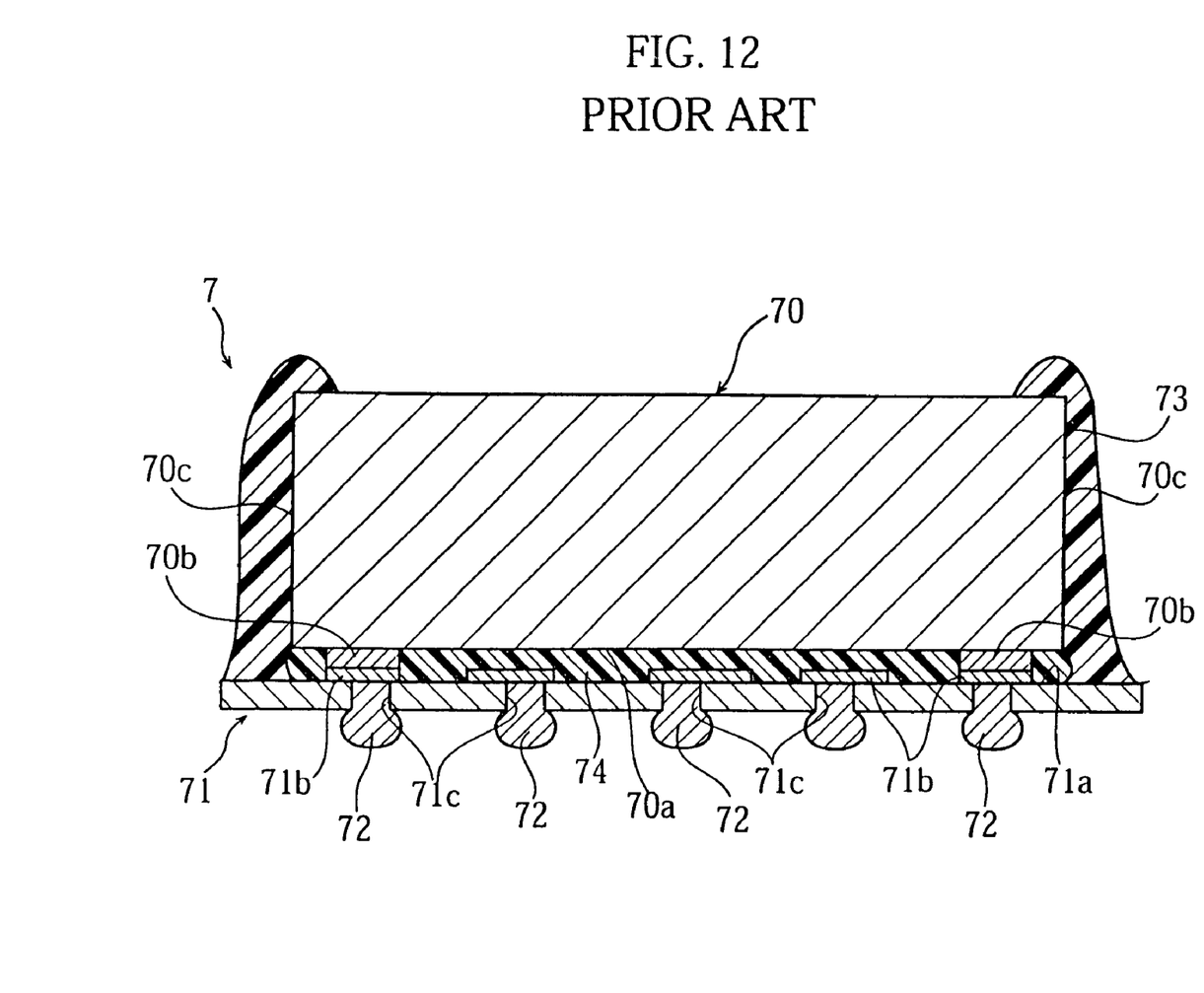
FIG. 12 is a sectional view of a prior art semiconductor device.

There is already known a semiconductor device having a mounting structure in which a semiconductor chip is mounted on an insulated substrate. An example of the structure is shown in FIG. 12. A semiconductor device 7 shown in this figure comprises a semiconductor chip 70 and an insulated substrate 71. The semiconductor chip 70 has a mounting surface 70a, which is connected with a surface 71a of the insulated substrate 71 via an adhesive 72 such as an epoxy resin. The semiconductor chip 70 has electrodes 70b faced onto and electrically connected with connecting terminals 71b of the insulated substrate 71. The insulated substrate 71 is a flexible film of e.g. a polyimide resin, and formed with a plurality of through holes 71c disposed in a grid pattern, each leading to one of the connecting terminals 71b. Via these through holes 71c, each of the connecting terminals 71b is electrically connected with a solder terminal 72 formed on the other side of the insulated substrate 71. The semiconductor chip 70 has side surfaces 70c surrounded by a protective resin 73 provided by e.g. an epoxy resin. The solder terminals 72 are disposed in a grid pattern correspondingly to the through holes 71c, and specifically called BGA (Ball Grid Array).

The protective resin 73 is formed by first applying the epoxy resin which is not yet fully hardened in thermosetting process, to enclose the side surfaces 70c of the semiconductor chip 70, and then heating at a temperature of 150° C. through 200° C. to complete the thermosetting process. The protective resin 73 shrinks as it is thermally set, and shrinks further as it is cooled down to the room temperature. The insulated substrate 71 also shrinks. However, an amount of shrinkage in the insulated substrate 71 is smaller than that of the protective resin 73, since the insulated substrate 71 is formed of polyimide resin which is superior to the protective resin 73 (epoxy resin) in terms of heat resistance and has a smaller coefficient of thermal shrinkage. In addition, since the insulated substrate 71 is flexible, the insulated substrate 71 is sometimes warped when the epoxy resin cools after the thermal setting. If the insulated substrate 71 is warped, the insulated substrate 71 can no longer sit horizontally, and when placed, the solder terminals 72 closer to the edge of the insulated substrate 71 are raised higher. This potentially causes an open circuit when the semiconductor device 7 is mounted onto a circuit substrate for example.

There is another problem. The adhesive 74 which connects the semiconductor chip 70 with the insulated substrate 71 is commonly provided by an epoxy resin. Therefore, again due to difference in the amount of thermal shrinkage between the insulated substrate 71 and the adhesive 74, interfaces of the adhesive 74 with the insulated substrate 71 and with the semiconductor chip 70 come under a certain strain. Therefore, according to the mounting structure as in the semiconductor device 7 shown in FIG. 12, in which an electrode bearing surface (the mounting surface) 70a is faced to the insulated substrate 71, the circuit element of the semiconductor chip 70 comes under the strain, and could be damaged.

DISCLOSURE OF THE INVENTION

It is therefore an object of the present invention to avoid the warp of the insulated substrate and damage to the semiconductor chip, and to provide a mounting structure of the semiconductor chip capable of offering a good performance for a long time.

Another object of the present invention is to provide a semiconductor device having such a mounting structure.

Still another object of the present invention is to provide a method for favorably manufacturing the semiconductor device having such a mounting structure.

A first aspect of the present invention provides a mounting structure of a semiconductor chip onto an insulated substrate, in which the insulated substrate is made of a polyimide resin, at least a side surface of the semiconductor chip is protected by a protective resin provided by a polyimide resin, and the semiconductor chip is held by the protective resin with respect to the insulated substrate.

According to this arrangement, since the side surface of the semiconductor chip is enclosed by a polyimide resin, the semiconductor chip as mounted has its side surface protected. Further, since the semiconductor chip is held with respect to the insulated substrate, by a polyimide resin which is the same kind of resin that provides the insulated substrate, the following effects are obtained. First, the warp in the insulated substrate can be avoided. This is because the insulated substrate and the polyimide resin that encloses the semiconductor chip expand to a more or less the same extent if heated, and shrink to a more or less the same extent when cooled, in a process such as mounting the semiconductor chip. Second, a high level of adhesion is achieved between the insulated substrate and the resin that encloses the semiconductor chip, making possible to favorably keep a state of holding (state of mounting) and a state of protection of the semiconductor chip.

Preferably, the protective resin rides on an upper surface of the semiconductor chip. This arrangement offers the following effects. First, the polyimide resin which rides on the surface that is away from the insulated substrate reduces movement of the semiconductor chip away from the insulated substrate, keeping more favorably the state of mounting of the semiconductor chip. Second, if an external force is applied to an angled portion of the semiconductor chip as mounted, the external force does not act directly on the angled portion, and thus damage to the semiconductor chip is small.

Further, the protective resin may seal the semiconductor chip entirely.

According to a preferred embodiment of the present invention, an adhesive layer is provided between the semiconductor chip and the insulated substrate. If the semiconductor chip is formed with a bump, and the mounting to the insulated substrate is made in a facedown mode, a gap is formed between the semiconductor chip and the insulated substrate. The presence of the adhesive layer in this gap enables to avoid air inclusion in the gap, preventing such a problem that the air in the gap expands when the semiconductor chip and/or the insulated substrate are heated, causing a strain onto a circuit element in the semiconductor chip and damage the circuit element.

Preferably, the adhesive layer is provided by a polyimide resin. Polyimide resin has a superior heat resistance and a smaller coefficient of thermal expansion than epoxy resin. Therefore, even if the adhesive layer between the circuit element and the insulated substrate is made of a polyimide resin, an influence (strain) of the resin expansion and shrinkage caused by heating and cooling, on the circuit element in the semiconductor chip is smaller than in the case where an epoxy resin is used.

Preferably, the insulated substrate has a peripheral margin extending beyond the semiconductor chip, and the protective resin is formed to rise from the margin.

According to a preferred embodiment of the present invention, the semiconductor chip has an electrode bearing surface formed with a plurality of electrodes, and the insulated substrate is provided with external terminals disposed in a grid pattern, each made of a solder ball and electrically connected with a corresponding one of the electrodes. With this arrangement, the electrode bearing surface may be faced to the insulated substrate when the semiconductor chip is mounted onto the insulated substrate. Alternatively, the electrode bearing surface may be faced away from the insulated substrate, and the electrical connection of each electrode of the semiconductor chip with the corresponding external terminal is provided by a wire.

A second aspect of the present invention offers a semiconductor device comprising an insulated substrate and a semiconductor chip mounted on the insulated substrate. In this semiconductor device the insulated substrate is made of a polyimide resin, at least a side surface of the semiconductor chip is protected by a protective resin provided by a polyimide resin, and the semiconductor chip is held by the protective resin with respect to the insulated substrate.

A third aspect of the present invention offers a method of manufacturing a semiconductor device, comprising steps of: mounting a semiconductor chip on an insulated substrate; and covering at least a side surface of the semiconductor chip with a protective resin, thereby holding the semiconductor chip with respect to the insulated substrate. The method is characterized in that the protective resin is formed by thermal imidization of a liquid polyamide precursor.

Preferably, the mounting of the semiconductor chip to the insulated substrate includes steps of: forming a non-hardened or semi-hardened adhesive layer on the insulated substrate; and pressing the semiconductor chip onto the insulated substrate under heat via the adhesive layer. Further, it is advantageous if ultrasonic wave is applied to the semiconductor chip when pressing the semiconductor chip onto the insulated substrate under heat via the adhesive layer.

The other characteristics and advantages of the present invention will become clearer from the following description to be presented with reference to the accompanying drawings.

BEST MODE FOR CARRYING OUT THE INVENTION

Hereinafter, preferred embodiments of the present invention will be described with reference to the attached drawings.

Figure 1:
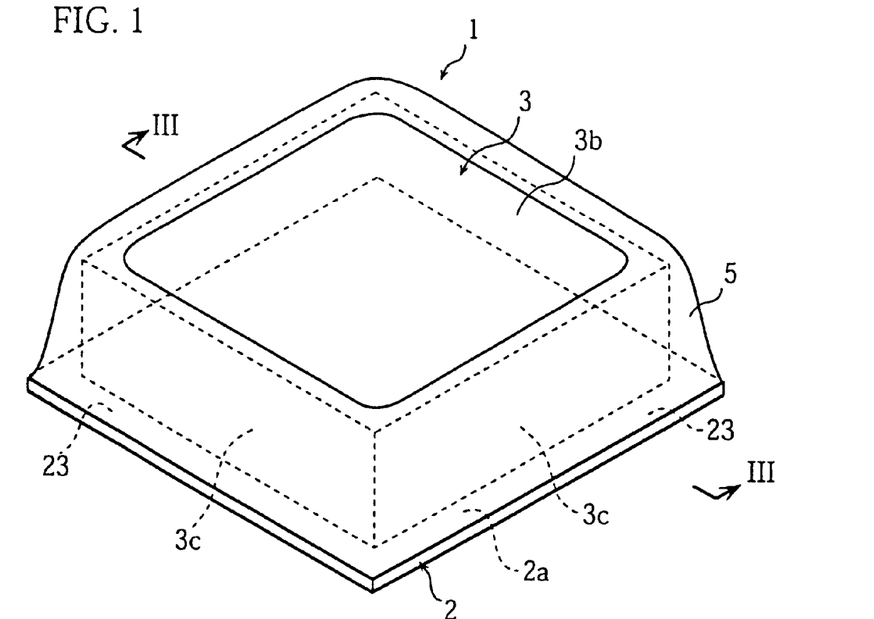
FIG. 1 is an overall perspective view of a semiconductor device according to a first embodiment of the present invention.
Figure 2:
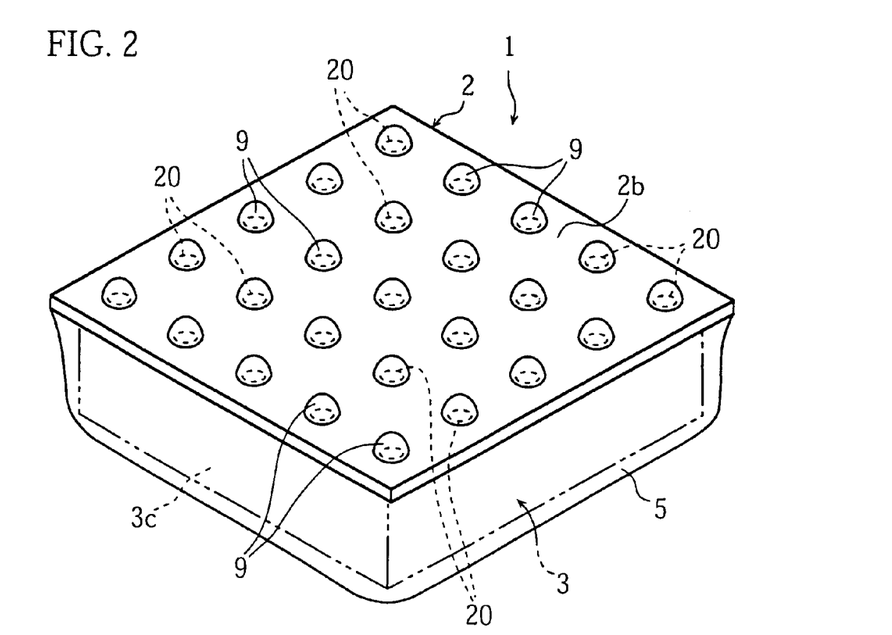
FIG. 2 is an overall perspective view of the semiconductor device in FIG. 1 viewed from a back side.
Figure 3:
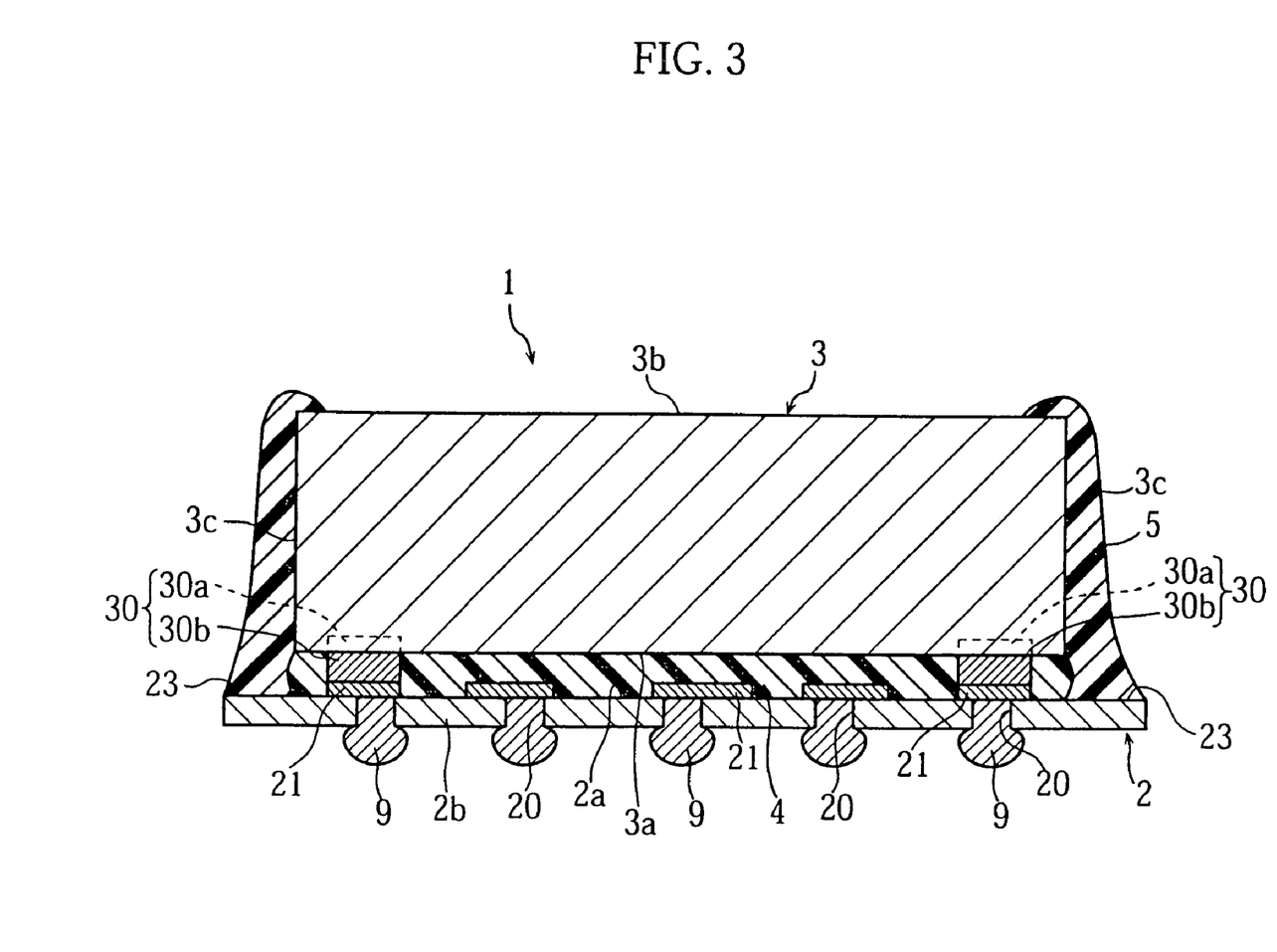
FIG. 3 is a sectional view taken in lines III-III in FIG. 1.

FIGS. 1 through 3 show a semiconductor device according to a first embodiment of the present invention. The semiconductor device according to the present embodiment has a structure so called BGA (Ball Grid Array).

A semiconductor device 1 according to the first embodiment comprises an insulated substrate 2, and a semiconductor chip 3 mounted on an upper surface 2a of the insulated substrate 2. The insulated substrate 2 and the semiconductor chip 3 sandwich an adhesive layer 4 in between.

The semiconductor chip 3 is generally a rectangular parallelepiped, including an electrode bearing surface (the bottom surface in the figure) 3a, an upper surface 3b, and four side surfaces 3c. The side surface 3c of the semiconductor chip 3 is enclosed by a protective resin 5. The insulated substrate 2 has a back surface 2b provided with a plurality of external terminals 9 projecting from the surface and disposed in a grid pattern. Each of the external terminals 9 is ball-shaped.

The semiconductor chip 3 is a bear chip such as an IC chip and an LSI chip. The electrode bearing surface 3a is formed with a plurality of electrodes 30. Each of the electrodes 30 includes an electrode pad 30a formed integrally with the semiconductor chip 3 and a bump 30b formed by e.g. gold plating on the terminal pad 30a. The bump 30b projects out of the electrode bearing surface 3a.

The insulated substrate 2 is made of a polyimide resin. As shown clearly in FIG. 2 and FIG. 3, the upper surface 2a and the back surface 2b of the insulated substrate 2 are both generally rectangular. The upper surface 2a and the back surface 2b of the insulated substrate 2 each has an area greater than that of the electrode bearing surface 3a. Thus, once the insulated substrate 2 is mounted with the semiconductor chip 3, the insulated substrate 2 has its peripheral margins 23 extend beyond the semiconductor chip 3.

The insulated substrate 2 is formed with a plurality of through holes 20 in a grid pattern. Further, the upper surface 2a of the insulated substrate 2 is formed with a plurality of connecting terminals 21 each connected with a corresponding one of the electrodes 30 of the semiconductor chip 3. Though not clearly shown in the figures, each of the connecting terminals 21 has an end faced to the corresponding electrode 30 and another end extending to a corresponding through hole 20, closing an upper opening of the through hole 20. Further, as clearly shown in FIG. 3, each of the external terminals 9 fills a corresponding one of the through holes 20 and connects with a corresponding one of the connecting terminals 21.

The adhesive layer 4 is provided by e.g. an epoxy resin, connecting the electrode bearing surface 3a of the semiconductor chip 3 with the upper surface 2a of the insulated substrate 2. Alternatively to the epoxy resin, the adhesive layer 4 may be formed of a polyimide resin, or may be formed of an electrically conductive anisotropic adhesive. The electrically conductive anisotropic adhesive can bond, with its resin component, the semiconductor chip to the insulated substrate whereas its electrically conductive particles provide electrical connection between the electrode of the semiconductor chip and the connecting terminal of the insulated substrate. A common resin component for the electrically conductive anisotropic adhesive is an epoxy resin, which may be replaced by a polyimide resin, however.

The protective resin 5 is provided by a polyimide resin, completely coats the extended margins 23 of the upper surface 2a of the insulated substrate 2 and the side surfaces 3c of the semiconductor chip 3, and rides on an outer edges of the upper surface 3b of the semiconductor chip 3. In other words, the margins 23 of the insulated substrate 2 and the upper surface 3b of the semiconductor chip 3 are integrally connected by the protective resin 5. As described earlier, the insulated substrate 2 is made of polyimide resin, and thus has a high level of adhesion with the polyimide protective resin 5. Further, the polyimide resin, which has a good heat resistance and a small thermal expansion coefficient, does not expand very much when the semiconductor device 1 is mounted and driven on a circuit substrate for example. Thus, the thermal expansion causes only a small stress acting on a place where the semiconductor device 1 is bonded, making possible to keep a stable state of operation.

Further, the side surfaces 3c of the semiconductor chip 3 and the edges of the upper surface 3b are directly protected by the protective resin 5. Therefore, if an external force is applied to the semiconductor chip 3 when handling the semiconductor device 1, damage to the semiconductor chip 3 is small. Further, since the margins 23 of the insulated substrate 2 is integrated with the semiconductor chip 3 by the protective resin 5, the margins 23 is not prone to direct influence of external force. This appropriately prevents such a situation in which the insulated substrate 2 comes off the semiconductor chip 3 due to external force acting on the margins 23 of the insulated substrate 2.

Figure 4:
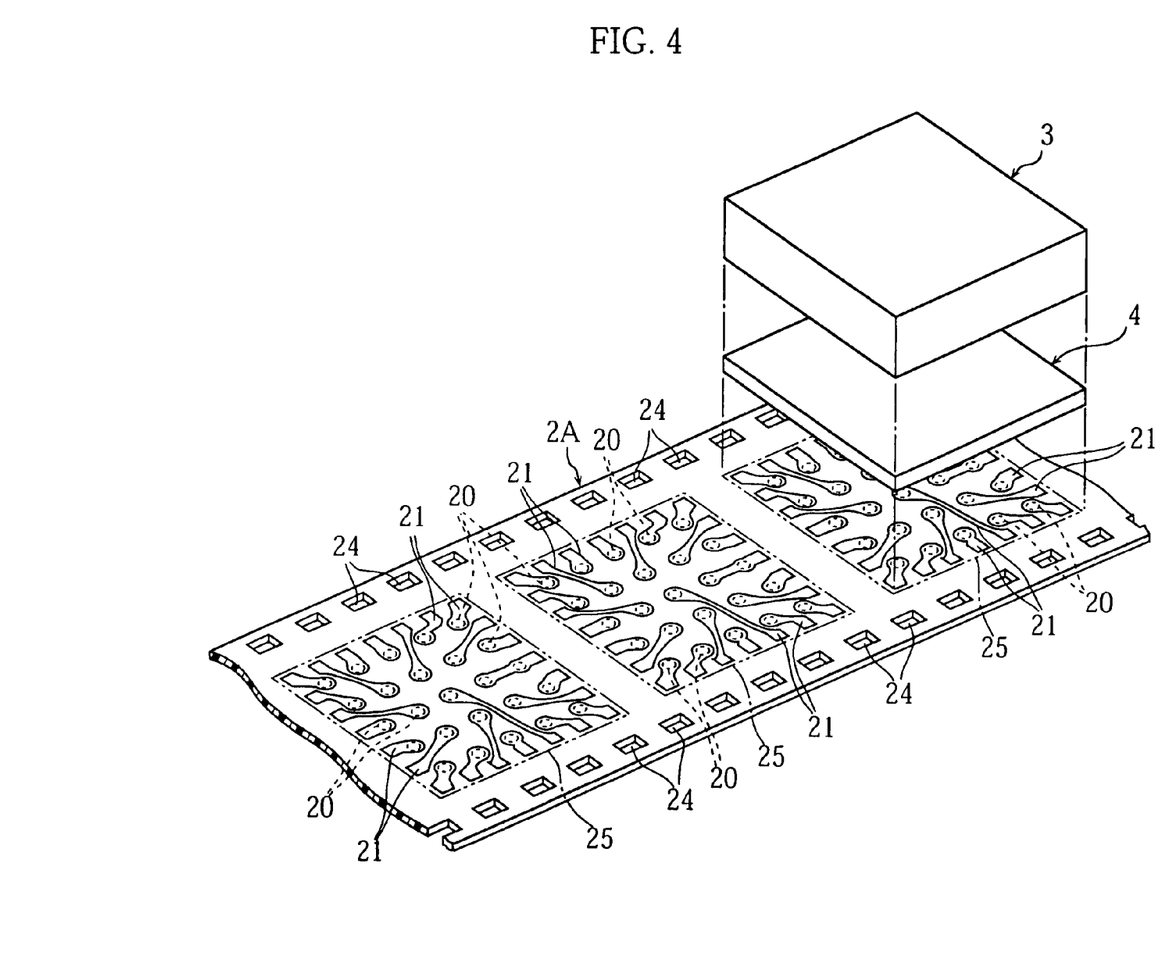
FIG. 4 is a perspective view showing a principal portion of a carrier tape used in manufacture of the semiconductor device shown in FIGS. 1 through 3.

The semiconductor device 1 is manufactured by using a carrier tape 2A shown in FIG. 4. The carrier tape 2A is like a long ribbon, and includes, at a predetermined longitudinal pitch, a plurality of square unit regions 25 (regions surrounded by imaginative lines in FIG. 4) each to be mounted with the semiconductor chip 3. The carrier tape 2A is formed of a polyimide resin. In each of the unit regions 25, the through holes 20 are formed in a grid pattern, on which the connecting terminals 21 are formed. These connecting terminals 21 are formed for example by first forming and then etching a film of metal such as copper on the surface of the carrier tape 2A. The metal film may be formed by plating, vapor deposition, or bonding a foil of metal. If the metal foil is bonded, the foil may have a pattern formed in advance. Each of the connecting terminals 21 has an end positioned to corresponding one of the electrodes 30 of the semiconductor chip 3, and another end closing a corresponding one of the through holes 20 from above. The carrier tape 2A has two widthwise margins each formed with a plurality of engaging holes 24 at a predetermined interval. By using these engaging holes 24, the carrier tape 2A is transported on an appropriate table.

Figure 5:
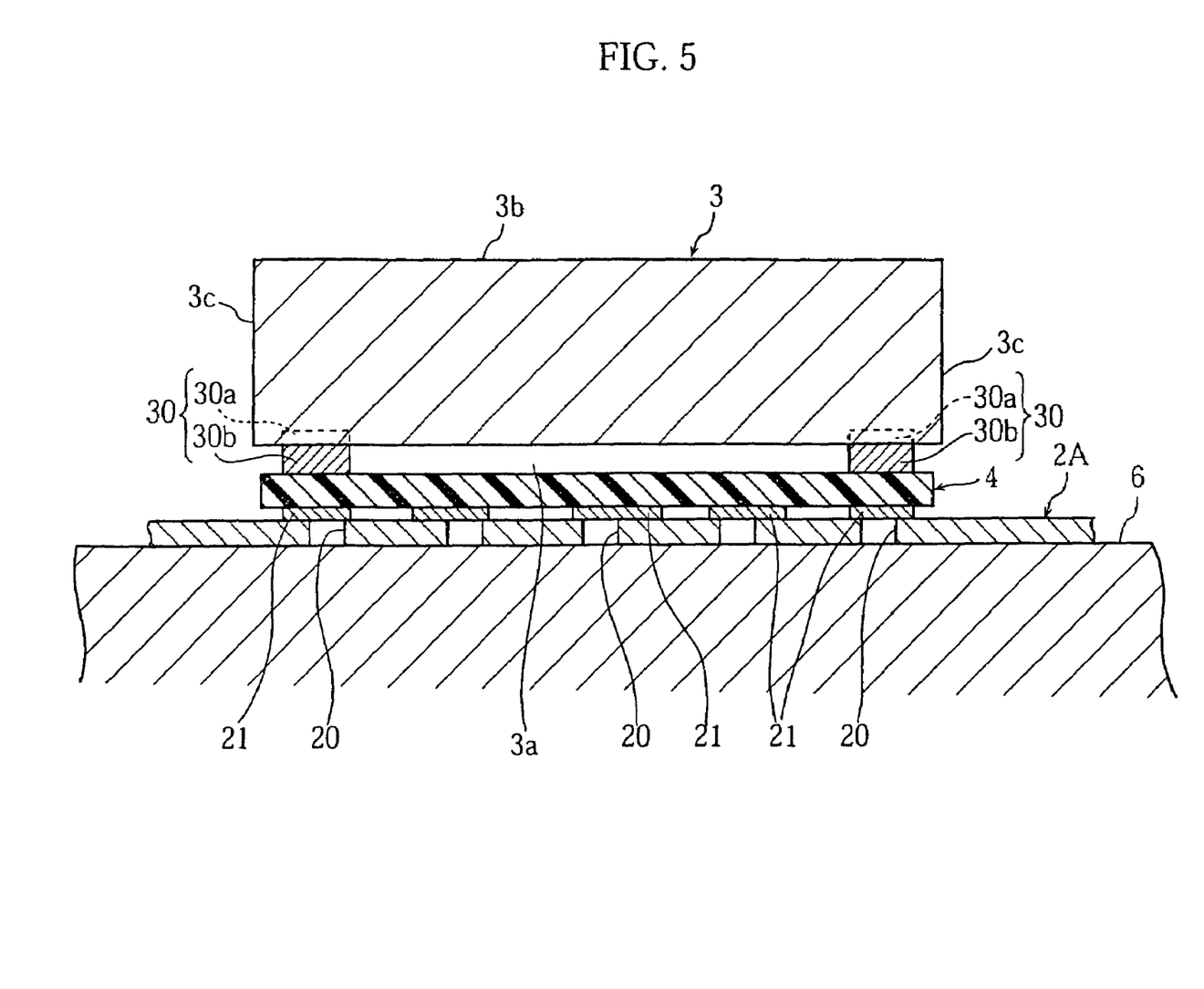
FIGS. 5 through 9 are sectional views illustrating steps of manufacture of the semiconductor device shown in FIGS. 1 through 3.

When manufacturing the semiconductor device 1 by using the carrier tape 2A as described, first, as shown in FIG. 4 and FIG. 5, the carrier tape 2A is placed on a table 6 incorporating a heater (not illustrated). Under this state, the semiconductor chip 3 is mounted, in a facedown mode, onto each unit region 25 of the carrier tape 2A via an adhesive sheet 4. In this step, each electrode 30 of the semiconductor chip 3 must be faced to the corresponding end of the connecting terminals 21 in the unit region 25. The adhesive tape 4 is provided by a half-hardened epoxy resin or polyimide resin. Alternatively to the adhesive sheet 4, a liquid adhesive may be applied to the unit region 25 or the electrode bearing surface 3a of the semiconductor chip 3, before the semiconductor chip 3 is mounted onto the unit region 25.

Figure 6:
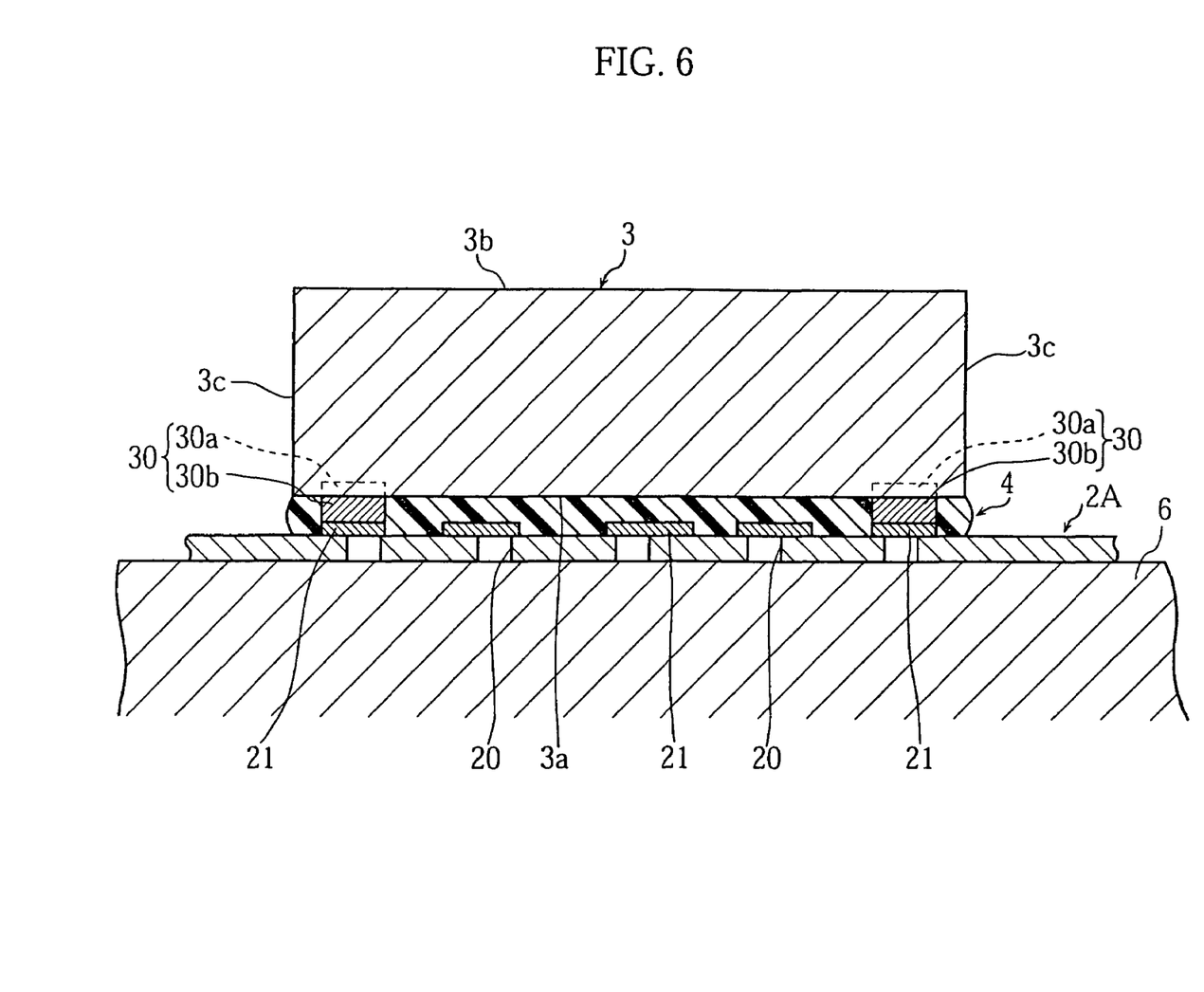

Next, as shown in FIG. 6, while heating the adhesive 4 by the heater incorporated in the table 6, the semiconductor chip 3 is pressed onto the carrier tape 2A, whereby mounting of the semiconductor chip 3 onto the carrier tape 2A is achieved. During this process, preferably, ultrasonic wave is applied to the semiconductor chip 3 to make sure the contact between the electrodes 30 of the semiconductor chip 3 and the carrier tape 2A.

Figure 7:
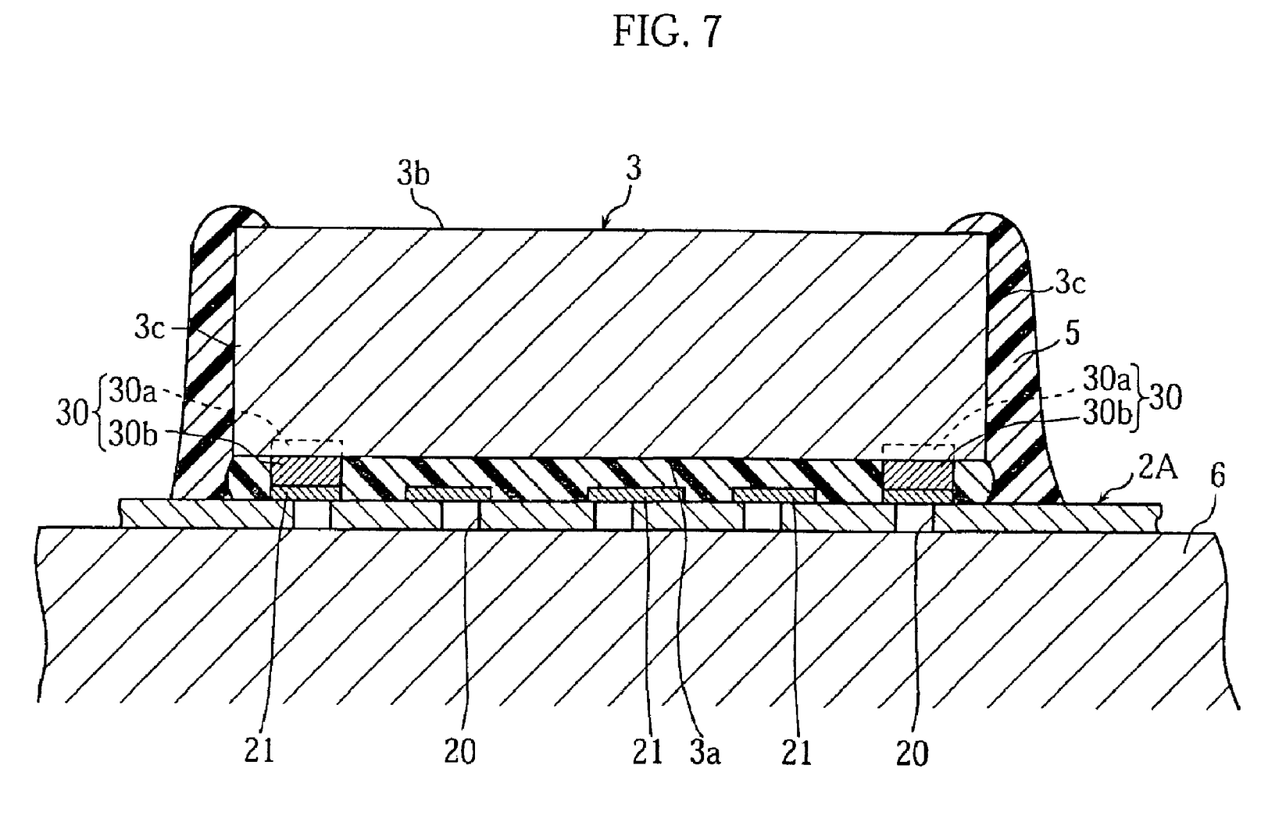

Next, as shown in FIG. 7, the protective resin 5 is formed by enclosing the surrounds of the adhesive 4, and the side surfaces 3c of the semiconductor chip 3. The protective resin 5 is formed for example by first applying a liquid polyamide precursor, i.e. poly amicacid (a polymer of acid anhydride and diamine before cyclization (hardening)) carried in a solvent, thereby enclosing the side surfaces 3c of the semiconductor chip and covering the edges of the upper surface 3b of the semiconductor chip 3. Then, the precursor is heated to cause imidization. The protective resin 5 thus formed offers the following advantages since it is made of polyimide resin as is the carrier tape 2A (the insulated substrate 2). First, a high level of adhesion is achieved between the protective resin 5 and the carrier tape 2A that are made of the same kind of resin. Second, the carrier tape 2A does not warp when the protective resin 5 is cooled after the thermal formation process, because the protective resin 5 and the carrier tape 2A shrink to a more or less the same extent.

Figure 8:
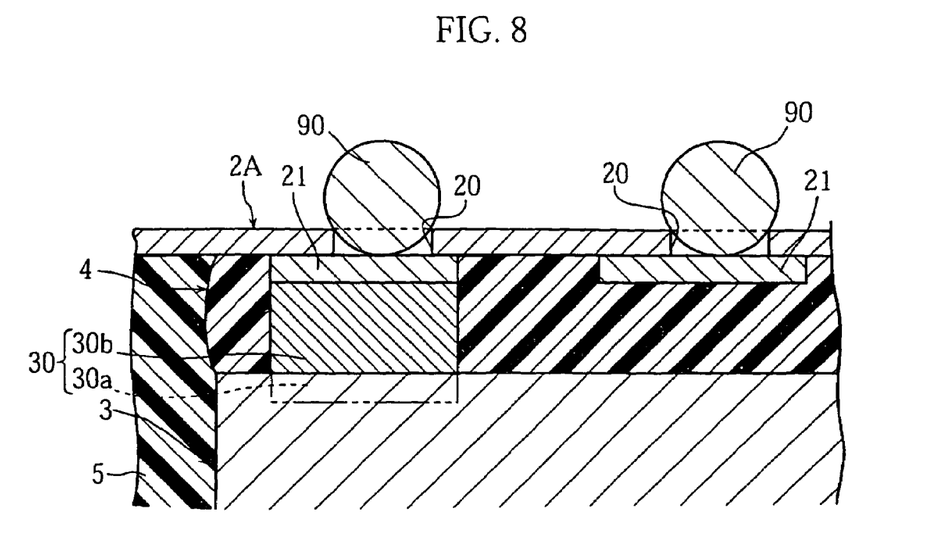
Figure 9:
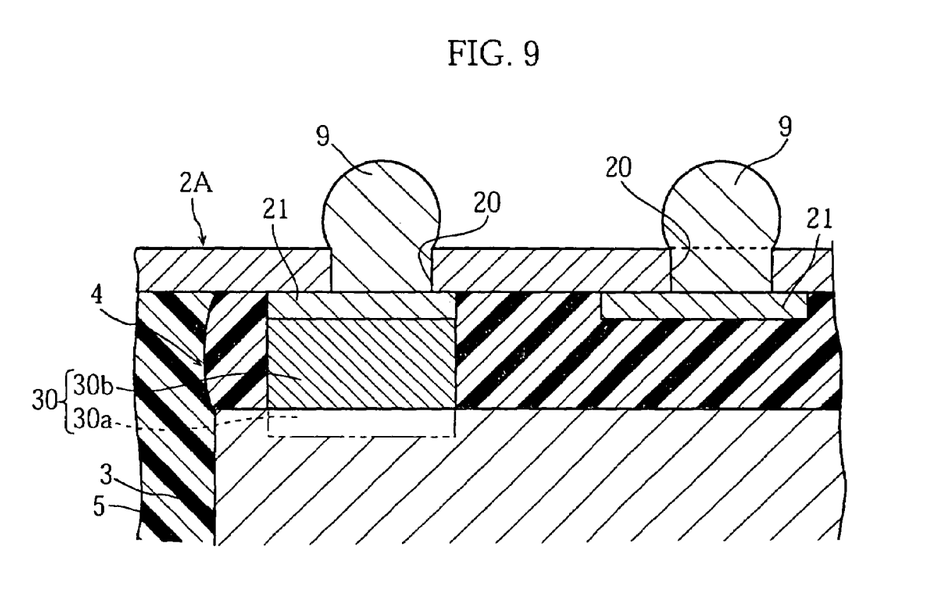

Next, as shown in FIG. 8, the carrier tape 2A is turned upside down, and the external terminals 9 are formed in a grid pattern on the back surface of the carrier tape 2A, corresponding to the grid pattern of the through holes 20 of the carrier tape 2A. Specifically, a solder ball 90 is placed with solder flux (not illustrated) in each of the through holes 20, and then the solder ball 90 is heated into molten and then cooled to solidify. Thus, as shown in FIG. 9, the ball-like external terminals 9 as shown in FIG. 9 are formed. Again in this forming process of the external terminals 9, the carrier tape 2A and the protective resin 5 are heated and then cooled, but since both are formed of polyimide resin, and therefore expand and shrink to a more or less the same extent, the carrier tape 2A is not prone to warp.

When all of the processes are completed as described, a region to serve the insulated substrate 2 is cut out of the carrier tape 2A, and the semiconductor device 1 as shown in FIG. 1 through FIG. 3 is obtained.

When utilized, the semiconductor device 1 is mounted on e.g. a circuit substrate (not illustrated) formed with a predetermined wiring, together with other electronic components. The mounting of the semiconductor device 1 onto the circuit substrate is performed by first placing the semiconductor device 1, with its external terminals 9 faced to corresponding terminals formed on the circuit substrate, re-melting and then re-solidifying the external terminals 9.

Figure 10:
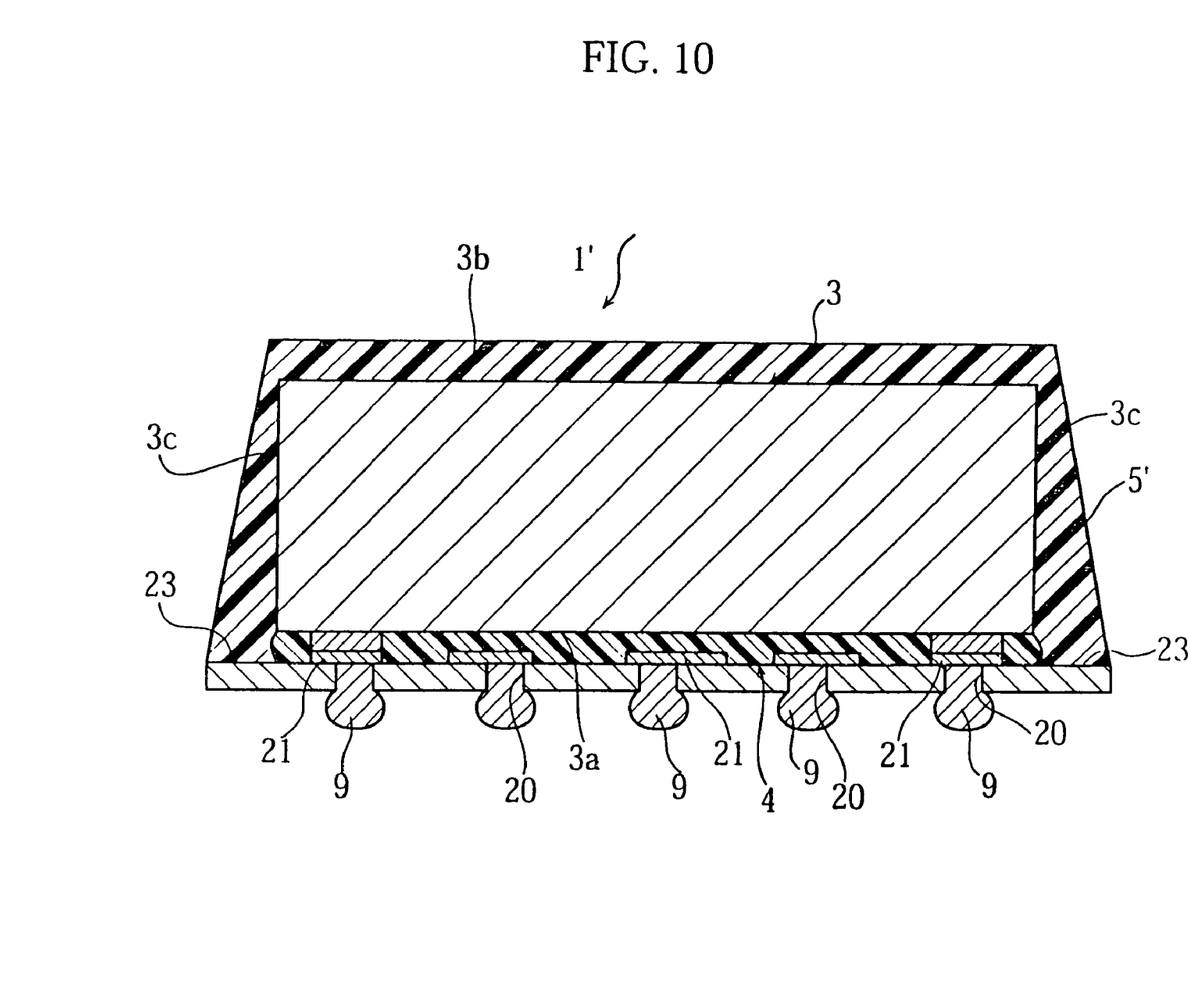
FIG. 10 is a sectional view of a semiconductor device according to a second embodiment of the present invention.

FIG. 10 shows a semiconductor device 1' according to a second embodiment of the present invention. The semiconductor device according to the present embodiment is similar to the semiconductor device 1 according to the first embodiment, but differs from the first embodiment in that the protective resin 5' is formed to cover not only the side surfaces 3c and the edges of the upper surface 3b of the semiconductor chip 3 but also the entire upper surface 3b of the semiconductor chip 3. The protective resin 5' as described can be formed e.g. by means of transfer forming using a metal mold, and of course may be formed by means of potting, in which a liquid polyamide precursor is applied to cover the chip and then thermally hardened, into a dome-like shape.

Figure 11:
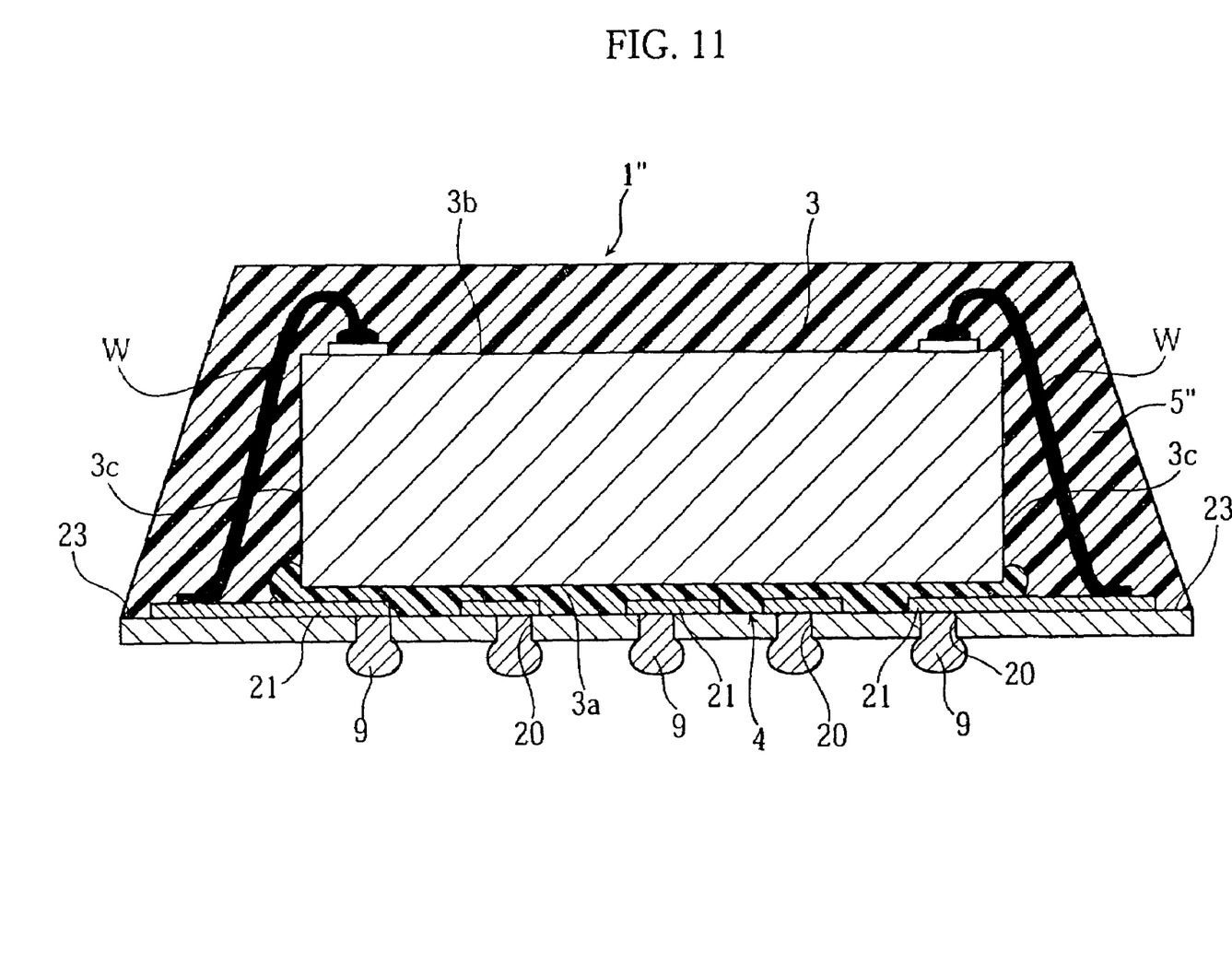
FIG. 11 is a sectional view of a semiconductor device according to a third embodiment of the present invention.

FIG. 11 shows a semiconductor device 1" according to a third embodiment of the present invention. The semiconductor device 1" according to the present embodiment is similar to the semiconductor device 1' according to the second embodiment, but differs from the second embodiment in that the semiconductor chip 3 is mounted on the insulated substrate 2 in a face-up mode, that electrical connection between each electrode of the semiconductor chip 3 and a corresponding connecting terminal 21 of the insulated substrate 2 are provided by a wire W, and that the protective resin 5" encloses the wires W, too.

According to the embodiments described above, description is made for a semiconductor device having a structure in which a single semiconductor chip mounted on an insulated substrate is protected by a protective resin. However, the present invention is also applicable to a semiconductor device having a structure in which a plurality of semiconductor chips mounted on an insulated substrate are protected by a protective resin.

What is claimed is:

1. A method of manufacturing a semiconductor device, comprising the steps of:

forming a non-hardened adhesive layer on an insulating substrate made of polyimide resin;

mounting a semiconductor chip on the adhesive layer;

pressing the chip onto the substrate via the adhesive layer under heat, the pressing of the chip being performed with ultrasonic waves applied to the chip; and covering at least a side surface of the chip with a protective resin, thereby holding the chip with respect to the substrate, wherein the protective resin is formed through thermal imidization of a liquid polyamide precursor by heating the liquid polyamide precursor on the substrate.

2. The method of claim 1, wherein the non-hardened adhesive layer comprises a liquid adhesive.

3. A method of manufacturing a semiconductor device, comprising the steps of:

forming a semi-hardened adhesive layer on an insulating substrate made of polyimide resin;

mounting a semiconductor chip on the adhesive layer;

pressing the chip onto the substrate via the adhesive layer under heat, the pressing of the chip being performed with ultrasonic waves applied to the chip; and covering at least a side surface of the chip with a protective resin, thereby holding the chip with respect to the substrate, wherein the protective resin is formed through thermal imidization of a liquid polyamide precursor by heating the liquid polyamide precursor on the substrate.

* * * * *